VOLTAGE CONTROLLED PULSE DELAY

Filed Dec. 18, 1964

INVENTORS
FREDERICK L. BECKNER
MICHAEL C. FISCHER
BY Claude Funkhouser
ATTORNEY
Robert F. Beers
AGENT 3,403,268

VOLTAGE CONTROLLED PULSE DELAY

Frederick L. Beckner and Michael C. Fischer, Austin, Tex., assignors, by mesne assignments, to the United States of America as represented by the Secretary of the Navy Filed Dec. 18, 1964, Ser. No. 420,257
2 Claims. (Cl. 307—293)

ABSTRACT OF THE DISCLOSURE

A delay pulse generator having a bistable device with two inputs, the first of which is operative to receive pulses from a trigger pulse circuit to change the output state of the bistable device to thereby feed a pulse to a voltage controlled pulse delay circuit which delays the pulse by an amount determined by the magnitude of a control voltage applied to the delay circuit and feeds the delayed pulse to an output circuit and also to a feedback circuit connected to the second input of the bistable device to change the state of bistable device back to the initial state.

This invention relates to electrical pulse delay circuits and more particularly to a delay pulse generator that may be used in automatic range tracking circuits of radar systems.

Numerous electronic devices require pulse generator circuits for operation. Some of these pulse generator circuits are required to produce a pulse output that is delayed a predetermined time after an input signal is received. In many applications, it is imperative that the amount of delay time of the pulse output be varied quickly and easily. Also, it is desirable when using jittered pulse rates that the individual pulses all be delayed a predetermined amount regardless of whether the pulse repetition rate is random or systematic. Prior art pulse generator circuitry for delaying pulses of current or voltage have been numerous and have taken many forms.

One common technique in the prior art for providing a delayed pulse is to use a pulse generating source which could be a free-running multivibrator that has its output coupled to a delay line. The delay line is an electrical network that reproduces at its output a waveform applied to its input terminals with little distortion but at a time delayed by an amount dependent upon the electrical length of the line. If other delay times are desired, the delay line may be tapped at intermediate points along its length or if it is desired to lengthen the delay time, the delay line may be lengthened. This characteristic makes the delay line unfeasible where it is necessary for changing the delay time quickly and efficiently.

The disclosed pulse delay circuitry of the instant invention has none of the disadvantages of the prior art circuitry, and it also provides the advantage of using a control voltage that delays the pulse train as a function of its instantaneous magnitude. Also, since the delay is not a function of the pulse repetition rate of the pulse train, it may be used with jittered pulse rate trains.

An object of the present invention is the provision of an electronic pulse delay circuit that may be used with jittered pulse trains.

A further object of the present invention is the provision of an electronic pulse delay circuit that produces a delayed pulse which is not a function of the pulse repetition rate.

Still another object of the present invention is the provision of an electronic pulse delay circuit that may be easily and quickly controlled.

Another object of the present invention is to provide a delay pulse circuitry that controls the delay time by controlling the magnitude of a control voltage.

Another object of the present invention is the provision of pulse circuitry that delays all of the pulses in a given pulse train by the same amount.

A further object of the present invention is the provision of an electronic delay circuitry that does not give a spurious output if the delay time is changed or shifted from one delay value to another.

Still another object of the present invention is the provision of an electronic delay circuitry that is of simple design and is constructed with a minimum of electronic components.

Another object of the present invention is the provision of a delay circuit that is remotely controlled and which is completely electronic in operation.

Another object of the present invention is to provide a pulse delay circuitry that is readily adaptable with transistorized circuitry.

Other objects, advantages and novel features of the invention will become apparent from the following detailed description of the invention when considered in conjunction with the accompanying drawings wherein.

Figures 1, 2:
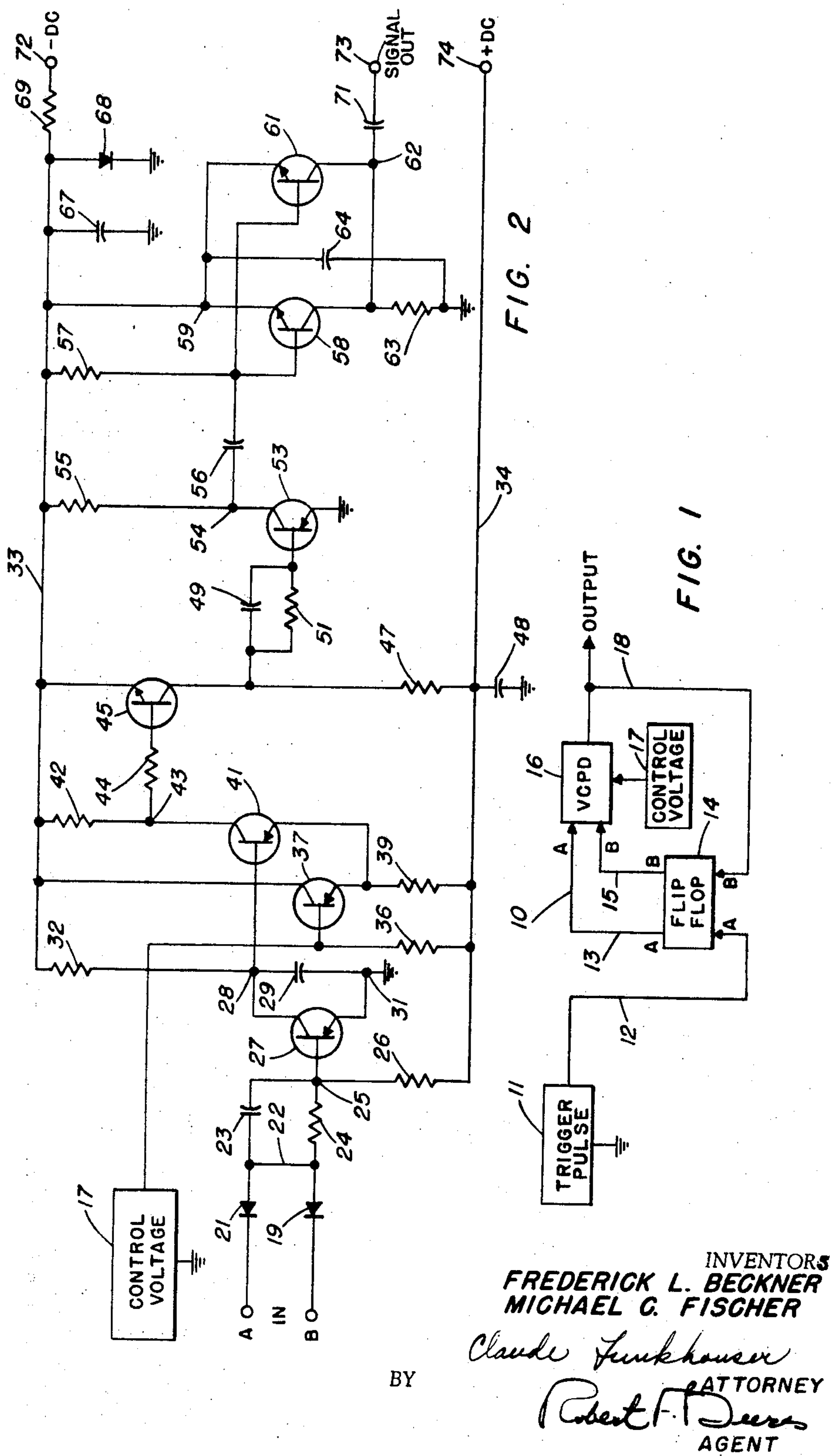
FIG. 1 represents a functional block diagram of the delayed pulse generator system.
FIG. 2 represents a schematic diagram of the voltage controlled pulse delay circuitry.

Referring now to FIG. 1 of the drawing, there is shown a complete pulse delay generator system in functional block form. A source of trigger pulse voltage is generated by functional block 11. This trigger pulse voltage may be manually operated or it may be automatic in operation depending upon the pulse train output sequence desired. The trigger pulse voltage is conducted to functional block 14 via line 12. Functional block 14 as shown is a conventional bistable multivibrator circuit of any suitable circuitry configuration which, upon delivery of an input pulse to the flip flop or bistable multivibrator circuitry, will cause it to change from one state to another. The output of the flip flop as it changes to its second state delivers a pulse voltage to the voltage controlled pulse delay circuitry which is represented by functional block 16. The circuitry configuration of the voltage controlled pulse delay functional block will be more fully explained later, and this circuitry is shown in greater detail in FIG. 2. The pulse output from functional block 16 is coupled through a feedback circuitry means 18 to the flip flop functional block 14 to change the flip flop circuit back to its initial state.

The multivibrator of functional block 14 may be any conventional semiconductor or vacuum tube bistable multivibrator circuitry configuration. Briefly, the two vacuum tubes or semiconductors of the multivibrator are biased so that the circuit has two stable states, and a trigger pulse of a predetermined voltage magnitude is required to make the circuit change from one state to the other. The circuit will remain in either state until it is caused to change to the other state by an application of a corresponding pulse signal. Thus, it is now apparent from a perusal of FIG. 1 that the flip flop circuit 14 once triggered by trigger pulse circuitry 11 changes state and delivers a pulse via electrical line 13 to the voltage controlled delay circuitry 16. This pulse is delayed an amount determined by the magnitude of the control voltage which is obtained from a control voltage source which is represented as functional block 17. The output pulse from the voltage controlled pulse delay circuitry is delivered to external circuitry (not shown) on the electrical line represented as the output. Once the pulse appears on the output line, it is conducted back through feedback circuitry 18 and causes the flip flop circuit to return to its initial state. After the flip flop circuitry 14 has returned to its initial state, it remains this way until another trigger pulse causes it to change and the sequence of of operation explained above continues over again. Thus, the trigger pulse circuitry 11 may deliver a pulse train of varying repetition rate or single pulses, whichever is suitable.

FIG. 2 shows the functional block 16 in more detail. Terminals A and B, that are representative of letters A and B in FIG. 1, conduct the respective pulse voltages to the base transistor 27 via a diode-capacitance-resistive network. Terminal A is connected to the cathode side of diode 21; the anode side being connected to one side of a capacitance 23. The other side of capacitance 23 is electrically connected to junction 25 which also has the base of transistor 27 electrically connected to it. Terminal B is connected to the cathode of diode 19; the anode of this diode being connected to junction 25 via resistor 24. A shorting line 22 electrically couples the anodes of the two diodes 19 and 21, respectively, together and also effectively parallels the resistance 24 and capacitance 23. A base resistance 26 couples the positive potential line 34 to junction 25. A capacitance 29 is electrically coupled across the emitter and collector electrodes of transistor 27 via junctions 28 and 31, respectively. Junction 31 is electrically fastened to ground potential. Junction 28 is connected to the base of transistor 41 and also is electrically connected to the negative potential line 33 via collector resistance 32. Transistor 41 has its emitter electrode electrically connected to the emitter of transistor 37 and a common emitter resistor 39 couples both of these emitters to positive potential line 34. The base of transistor 37 is electrically coupled to receive a control voltage from functional block 17. This control voltage circuitry is not shown in any detail and may be any circuitry of suitable configuration that either manually or automatically varies a voltage within predetermined limits. A base resistance 36 is used to electrically couple the base of transistor 37 to positive potential line 34. The collector electrode of transistor 37 is directly tied to the negative potential line 33 and the collector of transistor 41 is electrically coupled to negative potential line 33 via collector resistance 42.

Transistor 45 is electrically coupled to the collector of transistor 41 via base limiting resistance 44 and junction 43. The emitter of transistor 45, which is an NPN transistor, is tied directly to negative potential lead 33. The collector of transistor 45 is electrically coupled to positive potential line 34 via collector resistance 47. Electrically coupled to the collector to receive the output of transistor stage 45 is transistor 53; the base of transistor 53 being coupled to the collector of transistor 45 by a network of resistance and capacitance, resistor 51 and capacitor 49, respectively. The emitter of transistor 53 is directly coupled to ground potential and the collector is electrically coupled to line 33 via collector resistance 55 and junction 54. A coupling capacitance 53 connected to the bases of transistor 58 and transistor 61 electrically couples these transistors to junction 54. A common base resistance 57 electrically couples the bases of these two transistors to line 33. The collector of transistor 58 and transistor 61 is electrically tied to ground potential via a common resistance 63. The emitters of transistor 58 and transistor 61 are electrically coupled together at junction 59; junction 59 being electrically tied to line 33. Coupled from junction 59 to ground potential is a bypass capacitor 64. Junction 62, which is electrically tied to the common collector circuit of the two transistors 58 and 61, respectively, is coupled to output terminal 73 via coupling capacitor 71.

The potential necessary for operation of the circuitry is coupled across lines 33 and 34; the negative potential side coupled to terminal 72 and the positive terminal being connected to terminal 74. A network coupled between terminal 72 and line 33 made up of resistor 69, capacitance 67 and diode 68 provide a relatively constant negative potential on line 33. A bypass capacitor 48 coupled between the positive potential line 33 and ground provides low impedance alternating current coupling to ground potential.

The operation of the voltage controlled pulse delay circuitry configuration is as follows. The input pulse from trigger pulse circuitry 11 causes the flip flop 14 to send a pulse to the base of transistor 27 via diode-resistance-capacitance network. This pulse biases transistor 27, turning it off, so that capacitance 29 charges through resistor 32. A control voltage from functional block 17 of a predetermined magnitude is placed across base resistance 36. Since the two transistors 37 and 41 are electrically coupled together, the magnitude of the control voltage will hold transistor 41 in its cut-off state until the magnitude of the voltage across the capacitor 29 is greater than the magnitude of the control voltage on the base of transistor 37. Once the magnitude of the voltage across capacitor 29 becomes greater than the magnitude of the control voltage across base resistance 36, transistor 41 will conduct causing transistor 41 to produce a pulse signal. The pulse signal is then amplified by transistor amplifier circuits 45, 53, 58 and 61 in a conventional manner. The output signal pulse from 73 is then coupled back to flip flop 14 to cause it to change state and produce a pulse on the B terminal to cause transistor 27 to turn on. This action then resets capacitance 29 and the circuitry 16 is ready for the next pulse.

The present invention provides an effective time delay pulse generator circuitry configuration that changes the pulse time delay by an amount proportional to the magnitude of a control voltage. The control voltage magnitude may be changed at any time during the pulse generator's operational cycle to cause any desired time delay with complete freedom from spurious outputs. Also, the circuit is adaptable to change to accept positive input pulses and to produce either positive or negative output pulses.

Obviously many modifications and variations of the present invention are possible in the light of the above teachings. It is therefore to be understood that within the scope of the appended claims the invention may be practiced otherwise than as specifically described.

What is claimed is:

1. A delayed pulse generator circuitry for providing delay to a pulse by a time proportional to a control voltage, comprising:

bistable multivibrator means having first and second input terminals;

said first input terminal coupled to receive a trigger voltage to cause said bistable multivibrator to deliver a pulse output voltage;

a transistor having a base, emitter and collector, said base being connected to receive the pulse output voltage of said bistable multivibrator;

a direct current source connected to the collector of said transistor;

capacitance means connected to the emitter and collector of said transistor;

a control voltage circuit for providing a voltage level which controls the extent of delay of the received pulse;

a semiconductor circuitry means connected to said capacitance means and said control voltage circuit to compare the voltage across said capacitance means with said control voltage and operable to give a pulse output when the voltage across said capacitance means exceeds the control voltage; and feedback circuitry coupled to feed back the output of said pulse delay means to said second input terminal of said bistable multivibrator means;

whereby the trigger pulse voltage to said bistable multivibrator causes a pulse to be delivered at the output of the semiconductor means which is delayed by a predetermined time and the output from the semiconductor means triggers the bistable multivibrator means back to its initial state by means of the feedback circuitry.

2. The delayed pulse generator circuitry of claim 1 wherein said semiconductor circuitry means comprises:

first transistor having base, emitter and collector electrodes;

second transistor having base, emitter and collector electrodes;

said base of said first transistor electrically coupled to receive a control voltage;

said base of said second transistor electrically coupled to receive the magnitude of voltage across said capacitance means; and a resistance coupling each of said emitters of said first and second transistors to a common point.

References Cited

UNITED STATES PATENTS

| | | | |
|---|---|---|---|
| 3,225,221 | 12/1965 | Scott | 307—88.5 |
| 2,545,464 | 3/1951 | Hoeppner et al. | 328—111 |
| 3,049,625 | 8/1962 | Brockman | 307—88.5 |
| 3,054,910 | 9/1962 | Bothwell | 307—88.5 |
| 3,073,971 | 1/1963 | Daigle | 307—88.5 |
| 3,073,972 | 1/1963 | Jenkins | 307—88.5 |
| 3,297,883 | 1/1967 | Schulmeyer et al. | 307—88.5 |

ARTHUR GAUSS, *Primary Examiner.*

B. P. DAVIS, *Assistant Examiner.*